(12) United States Patent
Anand et al.

(10) Patent No.: US 6,577,156 B2
(45) Date of Patent: Jun. 10, 2003

(54) METHOD AND APPARATUS FOR INITIALIZING AN INTEGRATED CIRCUIT USING COMPRESSED DATA FROM A REMOTE FUSEBOX

(75) Inventors: Darren L. Anand, Essex Junction, VT (US); John Edward Barth, Jr., Williston, VT (US); John Atkinson Fifield, Underhill, VT (US); Pamela Sue Gillis, Jericho, VT (US); Peter O. Jakobsen, Milton, VT (US); Douglas Wayne Kemerer, Essex Junction, VT (US); David E. Lackey, Jericho, VT (US); Steven Frederick Oakland, Colchester, VT (US); Michael Richard Ouellette, Westford, VT (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 09/731,147

(22) Filed: Dec. 5, 2000

(65) Prior Publication Data

US 2002/0101777 A1 Aug. 1, 2002

(51) Int. Cl.[7] .................................................. G11C 7/00

(52) U.S. Cl. ........................ 326/37; 326/39; 365/225.7; 365/200; 365/230.03

(58) Field of Search ............................... 326/8, 10, 13, 326/38–41; 365/200, 225.7, 230.03

(56) References Cited

U.S. PATENT DOCUMENTS

| | | | | |
|---|---|---|---|---|
| 5,151,611 A | * | 9/1992 | Rippey | |
| 5,337,278 A | * | 8/1994 | Cho | ........................... 365/200 |
| 5,612,631 A | * | 3/1997 | Agrawal et al. | |
| 5,659,551 A | * | 8/1997 | Huott et al. | ................. 714/725 |
| 5,668,818 A | * | 9/1997 | Bennett et al. | |
| 5,789,970 A | * | 8/1998 | Denham | |
| 5,859,801 A | * | 1/1999 | Poechmueller | .............. 365/200 |
| 5,987,632 A | * | 11/1999 | Irrinki et al. | |
| 6,084,803 A | * | 7/2000 | Sredanovic et al. | ... 365/189.05 |
| 6,115,300 A | * | 9/2000 | Massoumi et al. | .......... 365/200 |
| 6,353,570 B2 | * | 3/2002 | Hwang et al. | ........... 365/225.7 |

* cited by examiner

*Primary Examiner*—Michael Tokar
*Assistant Examiner*—Vibol Tan
(74) *Attorney, Agent, or Firm*—Richard A. Henkler; Bracewell & Patterson, L.L.P.

(57) ABSTRACT

A method and apparatus for initializing an integrated circuit using compressed data from a remote fusebox allows a reduction in the number of fuses required to repair or customize an integrated circuit and allows fuses to be grouped outside of the macros repaired by the fuses. The remote location of fuses allows flexibility in the placement of macros having redundant repair capability, as well as a preferable grouping of fuses for both programming convenience and circuit layout facilitation. The fuses are arranged in rows and columns and represent control words and run-length compressed data to provide a greater quantity of repair points per fuse. The data can be loaded serially into shift registers and shifted to the macro locations to control the selection of redundant circuits to repair integrated circuits having defects or to customize logic.

28 Claims, 8 Drawing Sheets

METHOD AND APPARATUS FOR INITIALIZING AN INTEGRATED CIRCUIT USING COMPRESSED DATA FROM A REMOTE FUSEBOX

BACKGROUND OF THE INVENTION

1. Technical Field

The present invention relates generally to fuse-programmable integrated circuits, and more particularly, to integrated circuits having a fuse-read startup sequence.

2. Description of the Related Art

Fuse-programmable integrated circuits are used in applications requiring customization and/or repair of manufacturing defects. Functional testing of integrated circuits and printed circuit boards is necessary to assure defect-free products. In many instances, it is possible to repair integrated circuits subsequent to manufacture of a wafer by providing redundant circuit elements that can be selected by fuse-programmable logic. For example, an entire column in a memory array may be replaced with a spare column, if there is a defect detected in one of the row cells that would otherwise make the memory unusable. The redundant cells make it possible to increase production yields at the cost of increased circuit area via redundant circuits and fuse electronics.

The above-mentioned fuses include electrically blown fuses (e-fuses) that may be programmed by passing a large current momentarily through a fuse, and laser programmable fuses that may be programmed by vaporizing material with a laser. An anti-fuse technology can also be implemented on an integrated circuit, where the fuse controls the gate of a transistor and the transistor conducts to produce a short when the fuse is blown.

Application-specific integrated circuits (ASICs) may include large quantities of embedded memory. The included memories typically contain redundant circuit elements in order to repair defects. The selection of replacement elements from the available redundant elements requires a large number of fuse values. For example, embedded SRAM macros within the Cu-11 ASIC design system marketed by International Business Machines Corporation contain 80 fuse values per macro instance. Therefore, an ASIC using 128 instances of a macro containing 80 fuse values will result in a total of 10,240 fuse values. Embedded dynamic random access memory (eDRAM) macro designs typically include still more fuse values. Each one megabit section of eDRAM in the Cu-11 ASIC design system contains 344 fuse values, and there may be as many as 256-1 megabit sections of eDRAM used within an ASIC design. The resulting number of fuses will be 88,064 per ASIC chip. It is desirable to reduce the number of required physical fuses to repair these integrated circuits.

In circuits designed using functional blocks or macros, such as an application-specific integrated circuit (ASIC) built from a library of macro cells, the fuses for that cell will be associated with the macro. In correcting defects or customizing these ASICs, the co-location of the fuses presents a problem in that fuses are not typically compatible with the balance of the circuitry. E-fuses require large circuit paths for the programming current so that the voltage drop produced during programming does not eliminate the ability to program the fuse, increase the programming time above acceptable limits, or increase local heating that may damage the functional electronics. Laser-programmable fuses require a large guard ring so that other circuitry is not destroyed by the laser. Additionally, present integrated circuit designs provide for "deep" stacks of circuits, allowing macros to be located below wires within layers of the die. Laser-programmed fuses and e-fuses are implemented with no wires allowed above and no circuitry allowed below the fuses, since the blowing of a fuse, whether by a laser or by an electrical means, could damage wires located over or circuitry located beneath the fuses. Finally, interconnect methods such as lead ball contact arrays are incompatible with laser blown fuses since the laser needs to have direct "line of sight" access to the fuse. Since the outer layer containing the contact array must occupy the surface layer, laser programmable fuses must be located in other areas of the die.

The inability to locate macros containing fuses underneath other wires and contact arrays or above other circuits severely limits the use of macros containing fuses. It is possible to move all of the fuses to a location where the fuses will not interfere with contact arrays, but moving fuses away from the associated macros requires custom design and either a large quantity of interconnects running from the fuses to the associated macros, or a scheme for moving the values from the fuses to their associated macros requiring a local latch and a remote latch for each fuse. A local latch is typically needed at the fuse, since the fuse cannot typically be used to form part of the logic in the integrated circuit, especially with copper fuse technology. If a potential is placed across the ends of a blown fuse, it will re-grow, forming "copper dendrites." The blown fuse may eventually have a low enough resistance to read as if it had not been blown.

In light of the foregoing, it would be desirable to provide a method and apparatus for fuse-programming integrated circuits whereby fuses may be shared among redundant elements. Furthermore, it would be desirable to provide a method and apparatus for fuse-programming integrated circuits using fuses that do not have to be located within their associated memory macros.

SUMMARY OF THE INVENTION

All objects, features, and advantages of the present invention will become apparent in the following detailed written description.

The objective of repairing macros within integrated circuits using remotely located fuses without requiring circuit runs from a fuse to macros or local latch/remote latch pairs is achieved in a method and apparatus for initializing an integrated circuit using compressed data from a remote fusebox. Compressed control data is read from a fuse matrix and the compressed data is decoded to produce decompressed control data. Then, the decompressed control data is latched to control functional circuit elements within the integrated circuit. The invention may also be embodied in a multi-chip module where a single fusebox is used to initialize multiple dies.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DETAILED DESCRIPTION OF THE PREFERRED EMBODIMENT

Figure 1:
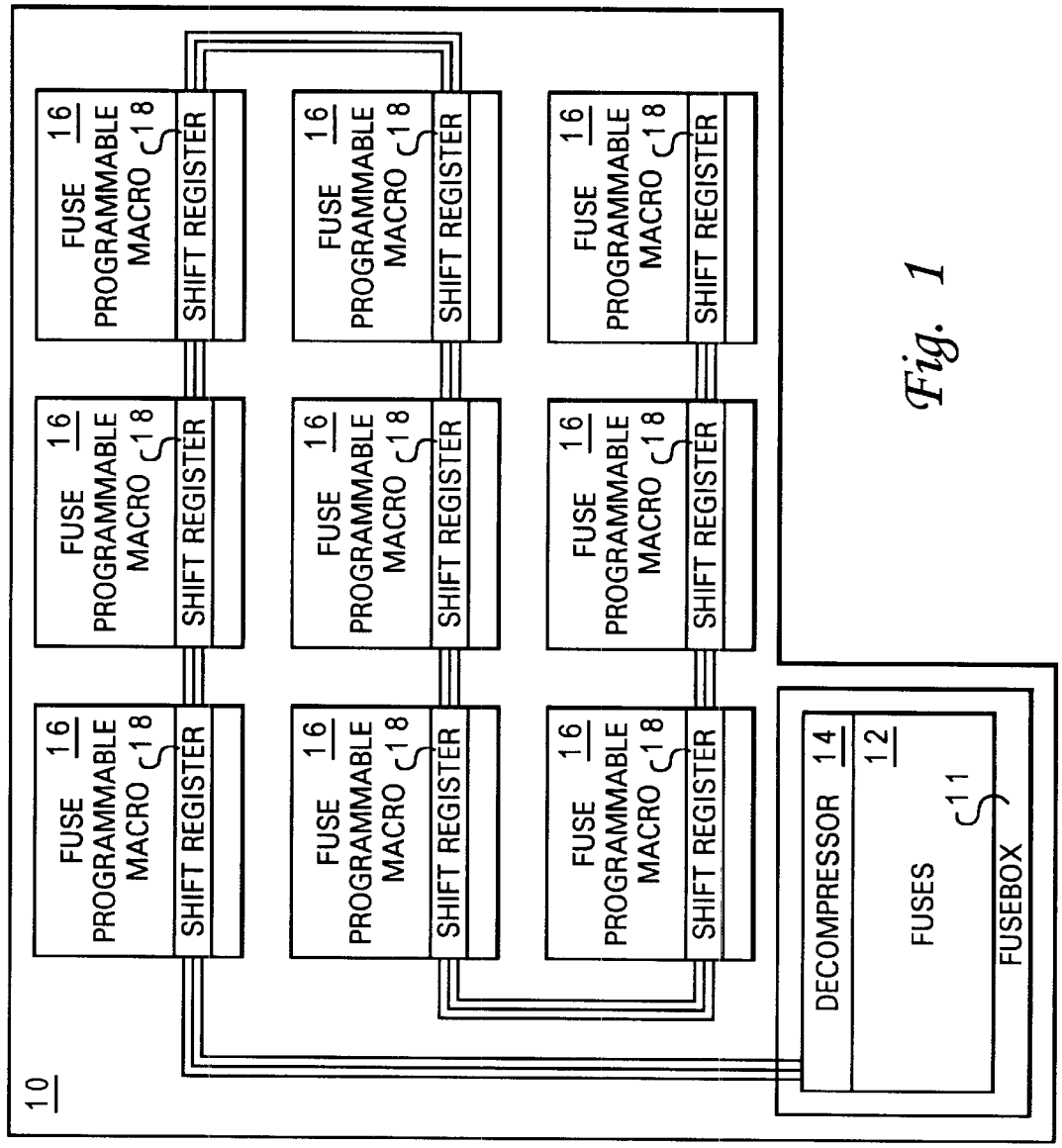
FIG. 1 is a block diagram of an integrated circuit in accordance with a preferred embodiment of the invention.

With reference now to the figures, and in particular with reference to FIG. 1, there is depicted a block diagram of an integrated circuit in accordance with a preferred embodiment of the invention. Integrated circuit 10 contains a plurality of fuse programmable macros 16. Fuse-programmable macros 16 can implement a variety of functional circuits within integrated circuit 10 and are not necessarily identical or similar in nature, but are customizable and/or repairable using fuse data retrieved from a fusebox 11. Repairable circuits include memory array macros wherein the fuse data is used to remove a memory element (e.g., a row or column) and select a redundant element to replace its function. It will be understood that replacement of memory elements can be accomplished with multiplexers and demultiplexers or a variety of other techniques well known in the art. Customizable circuits include programmable logic array macros wherein the fuse data is used to generate combinatorial logic, circuits that embed security codes on a per-integrated circuit basis, et cetera.

The present invention concerns the manner in and means by which control data for controlling the customization and/or repair of integrated circuit 10 is accomplished. Fuses 12 are arranged in a block isolated from the fuse-programmable macros, in order to overcome the obstacles associated with placing fuses such as interference with interconnect points, inefficient use of die area due to guard rings, laser-programmable fuses or e-fuses requiring the entire layer stack for implementation, et cetera. The fuse data contains compressed information that is decompressed by decompressor 14 to produce the control data for repairing or customizing fuse-programmable macros 16. Shift registers 18 within the macros are arranged in chains to allow serial clocking of decompressed control data received from decompressor 14, so that at initialization, the control data is propagated to fuse-programmable macros 16. After initialization, the functional logic implemented by fuse-programmable macros 16 will be configured for operation of integrated circuit 10.

It should be understood that the implementation of integrated circuit 10 is not restricted to a single fusebox 11 coupled to a single chain of shift registers 18, but that the techniques of the present invention allow for a design having multiple fuseboxes coupled to multiple shift register chains. Alternatives include a single fusebox coupled to multiple shift register chains with parallel data output from the fusebox to supply each of the chains. Choice of a particular design implementation is made on the basis of macro placement within the integrated circuit, and the initialization time period that is permissible. As the number of shift registers holding control data received from fusebox 11 increases, the amount time required to initialize integrated circuit 10 correspondingly increases. For applications wherein integrated circuit 10 is power-cycled frequently, or must initialize rapidly such as personal digital assistant (PDA) applications, it may be desirable to implement a quantity of shift register chains fed in parallel by one fusebox or individually by several fuseboxes.

Figure 2:
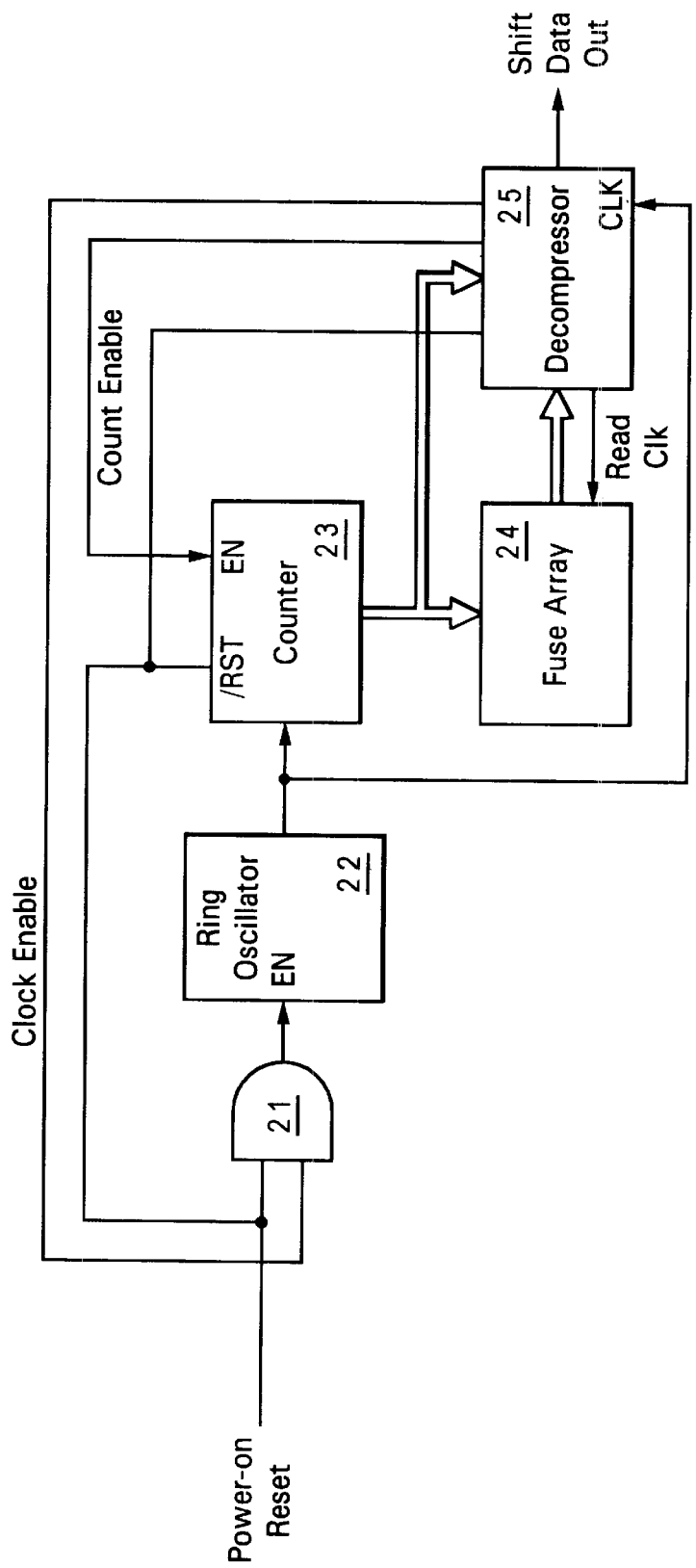
FIG. 2 is a block diagram of the fusebox circuit within the integrated circuit of FIG. 1.

Referring now to FIG. 2, a detailed block diagram of fusebox 11 of FIG. 1 is shown. Power-on reset is a signal that may be externally supplied or internally generated within integrated circuit 10. Power-on reset indicates that integrated circuit 10 should be initialized for operation. Power-on reset is combined in an AND gate 21 with a disable signal produced by decompressor 25. Counter 23 is held in a reset state until power-on reset is asserted. The state of decompressor 25 is also held in a reset state until power-on reset is asserted. The output of AND gate 21 enables a ring oscillator 22 that operates decompressor 25. When enabled by the count enable signal from decompressor 25, ring oscillator 22 operates the counter until decompressor 25 sets the clock enable signal to the negative state, disabling ring oscillator 22. Thus, counter 23 begins to count when power-on reset is activated and stop when decompressor 25 clock enable output indicates decompression is complete. Counter 23 is prevented from counting until power-on reset is activated. The outputs of counter 23 select rows within fusebox 24, retrieving two compressed control data words that are coupled to decompressor 25.

Decompressor 25 is a state machine that decompresses the two compressed control data words according to a mode select encoded in the first two words of fuse array 24 (selected by counter value zero). The control word contains information in addition to the mode select bits, such as the specific data width of fuse array 24 and the length of the decompressed control data shift register. Encoding the length of the decompressed control data shift register in the first two fuse array 24 words provides the state machine with information about the number of shift cycles that need to occur in order to fill the decompressed control data shift register chain. Encoding the width of fuse array 24 permits the same state machine design to be used with fuse arrays of differing data widths. This is desirable in that differing integrated circuit designs will have differing fuse layout ground rule requirements. It is generally desirable to minimize the quantity of fuses placed on the die, so the ability to vary the length and width of the data without designing a custom decompressor is a preferred feature for custom logic implementations.

A row within fuse array 24 contains two fuse words. In practice, half of the row data, or one fuse word, in fuse array 24 is reversed in a mirror-image, so that the outermost bits of the fuse array can be physically absent from the fuse array design and ignored by decompressor 25 when a smaller fuse array is implemented.

The decompression schemes implemented by decompressor 25 are mode selectable by the control word loaded from the first location in fuse array 24. The modes supported are: image mode, in which the control data is shifted out without modification (no compression), run-length mode (RLL) in which zeros are shifted out for control data words in which a zero count is encoded, and variable mode in which one of the control data word bits indicates a fixed value (zero or one) to shift out for the count encoded in the control data word.

Table 1 shows the format of the control word and data words encoded in fuse array 24.

TABLE 1

| | | | | | | | | | | | | Bit | | | | | | | | | | | |
|---|---|---|---|---|---|---|---|---|---|---|---|---|---|---|---|---|---|---|---|---|---|---|---|
| 23 | 22 | 21 | 20 | 19 | 18 | 17 | 16 | 15 | 14 | 13 | 12 | 0 | 1 | 2 | 3 | 4 | 5 | 6 | 7 | 8 | 9 | 10 | 11 |
| N/A | M1 | M0 | FV | WS | — | L16 | L15 | L14 | L13 | L12 | L11 | L0 | L1 | L2 | L3 | L4 | L5 | L6 | L7 | L8 | L9 | L10 | N/A |
| MSB | | | | | | | | | | | | LSB | RLL | RLL | LSB | | | | | | | | MSB |
| MSB | | | | | | | | | | | | VAL | RLL | RLL | VAL | | | | | | | | MSB |

The second row of Table 1 shows the organization of the control word in the first location of fuse array 24. The lower half of the word has been bit reversed and the outer bits are unused (N/A) to accomodate fuse arrays 24 of 22 bit width. M1 and M0 encode the mode, with 0 indicating shift all zeros (no fuses blown), Mode 1 indicates RLL decompression mode, and Mode 2 image mode (no compression). FV=0 indicates that the mode 1 RLL value to shift is zero, FV=1 indicates that bit 1 of an RLL encoding control data word will determine the fixed value to shift for a run. L16–L0 encode the total number of bits to be shifted (data length) allowing for 128 K bits to be shifted from the decompressor.

The third row of Table 1 show the significance of the control data word bits when MODE=1 and FV=0. Each location holds two control data words, with the lower word reversed in bit order so that smaller fuse arrays may be used. RLL indicates whether or not the control data word half encodes a run (1) or an image (0), the aid balance of the word encodes image data or the run-length count from least significant bit (LSB) to most-significant bit (MSB). For a 22-bit control data word size, the MSB values are ignored. The fourth row of Table 1 shows the significance of the control data word bits when MODE=1 and FV=1. VAL is the fixed value to shift when RLL=1, otherwise if RLL=0 it is the LSB of the image data. If MODE=2, there is no compression, so all of the bits in the control data words are image bits.

Figure 3:
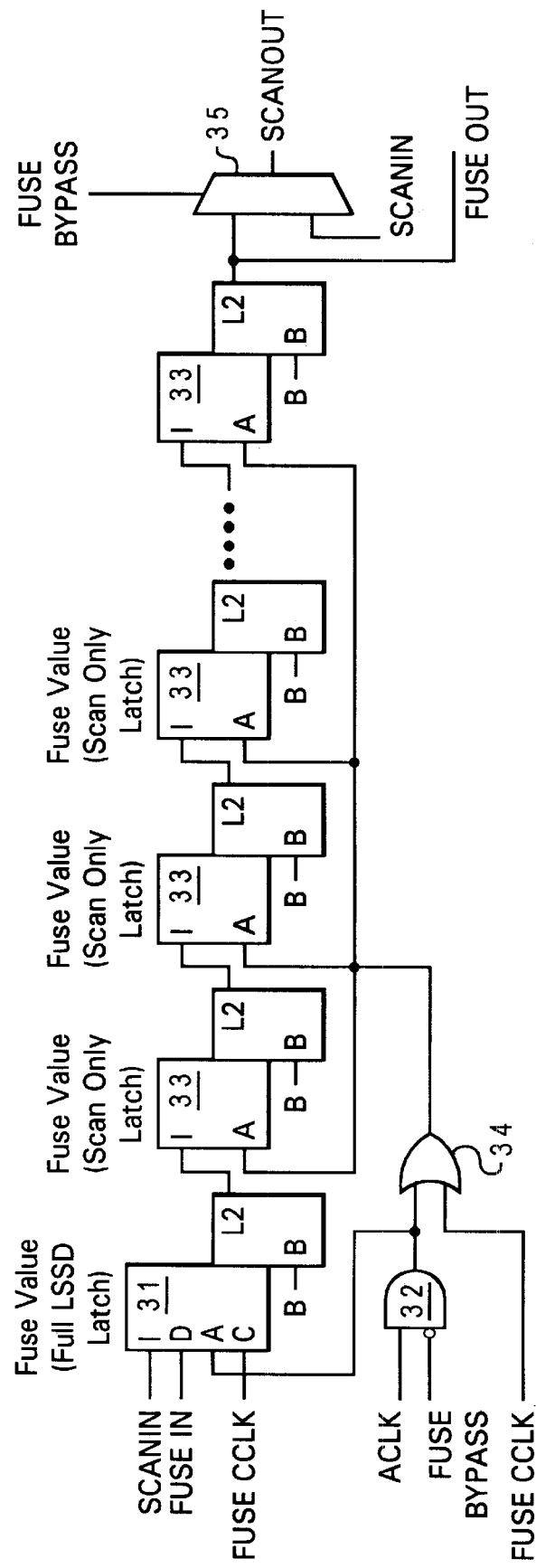
FIG. 3 is a schematic diagram of the shift registers within the integrated circuit of FIG. 1.

Referring now to FIG. 3, shift registers 18 of FIG. 1 are depicted in detail. The entry point for decompressed control data is a full level-sensitive scan design (LSSD) latch 31. This forms the first bit in the shift register, and provides compatibility between the LSSD design of integrated circuit 10 and fusebox 11 operation. Since the control data decompressed from fuses 12 must be maintained after initialization and during system level testing, the scan clocking of the shift registers 18 must be deselected. FUSE BYPASS disables the scan clock ACLK during system level scan operations, providing that scan clocks produced during system level testing do not propagate to shift registers 18 and corrupt the decompressed control data shift register values. The gated clock is combined in OR gate 34 with FUSE CCLK output from fusebox 11 which shifts the decompressed control data to shift registers 18. Control data is maintained in full LSSD latch 31 and scan-only latches 33. Since the FUSE BYPASS disables ACLK to scan only latches 33, shift clock B does not have to be modified to prevent system level testing from clocking out the control data. FUSE BYPASS also controls data selector 35, so that when system level testing is performed using LSSD scan clocks, the SCANIN is coupled to SCANOUT, thereby bypassing shift register 18, allowing other latches within the same chip-level LSSD scan chain to be tested.

Figure 4:
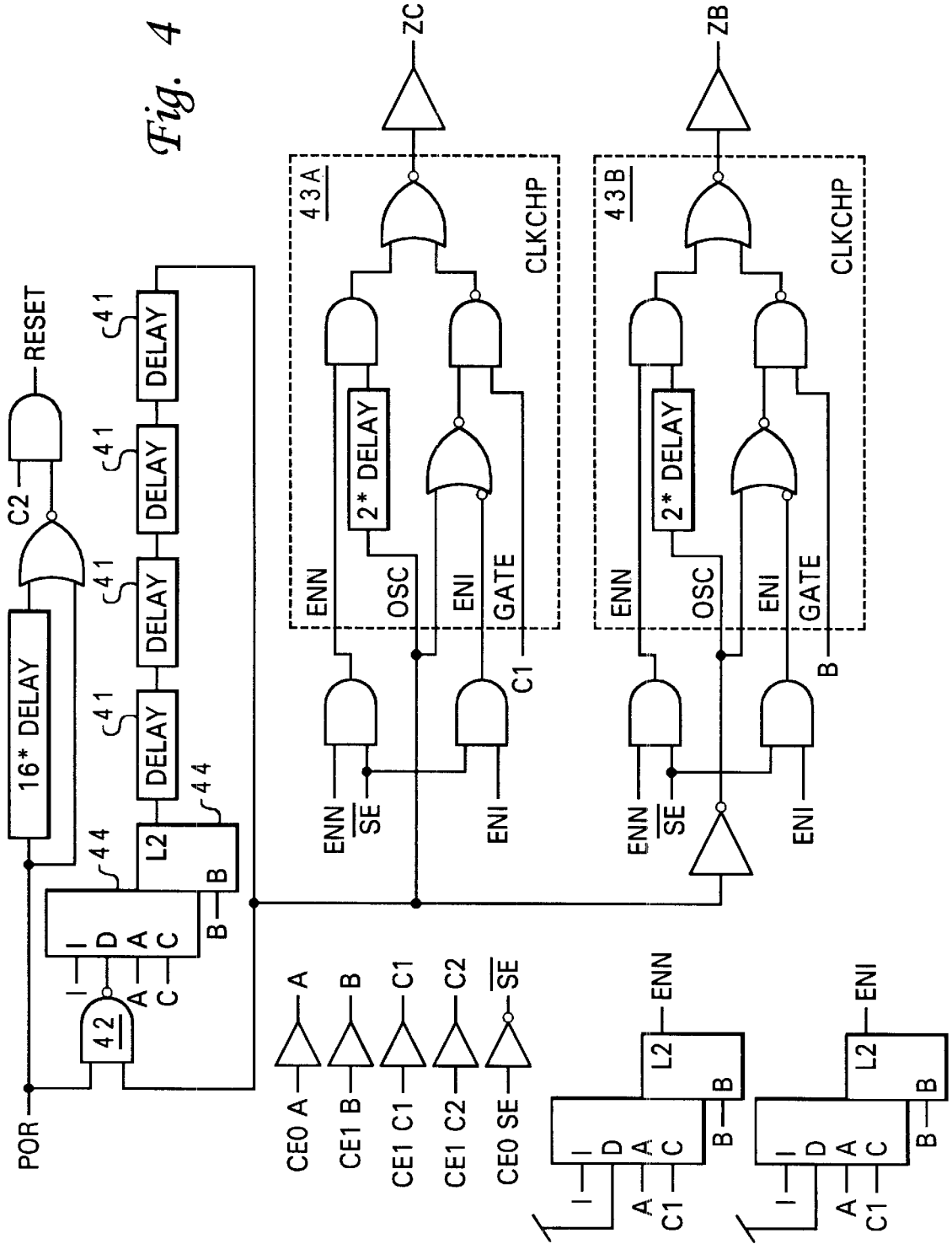
FIG. 4 is a schematic diagram of clock circuits within the decompressor within the fusebox circuit of FIG. 2.

Referring now to FIG. 4, clock circuits within decompressor 25 and ring oscillator 22 of FIG. 2 are shown in detail. In this circuit, delay elements provide a feedback signal to AND gate 42, which produces an input to master-slave latch pair 44. Master-slave latch pair 44 is held in transparent mode while integrated circuit 10 is initializing, in order to allow a feedback path for the ring oscillator two-phase clock generator. The two-phase clock is provided as input to clock choppers 43A and 43B which generate a two non-overlapping clock pulses ZC and ZB that are used for shifting the decompressed control data to shift registers 18. Signals C1 and B are used to clock the clock choppers 43A and 43B while integrated circuit 10 is operated by the manufacturing tester.

RESET is a stretched and inverted version of power-on reset signal POR, used by other circuits within integrated circuit 10 to ensure that reset is valid after clocking from clock chippers 43A and 43B has ceased and the decompressed control data has been loaded into shift registers 18.

Figures 5, 5A, 5B:
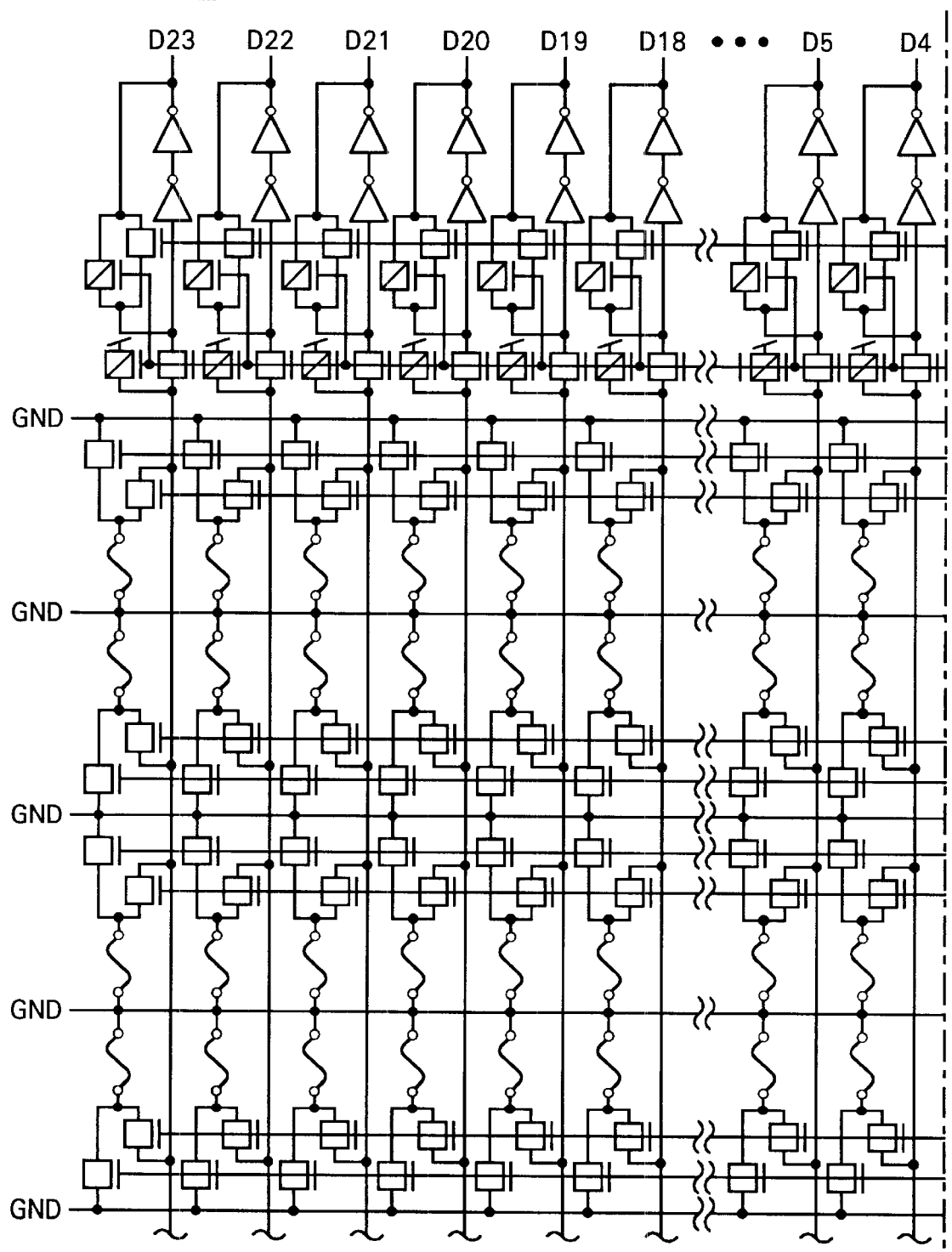
FIG. 5 is a schematic diagram of the fuse array of FIG. 2.
Figure 5B:
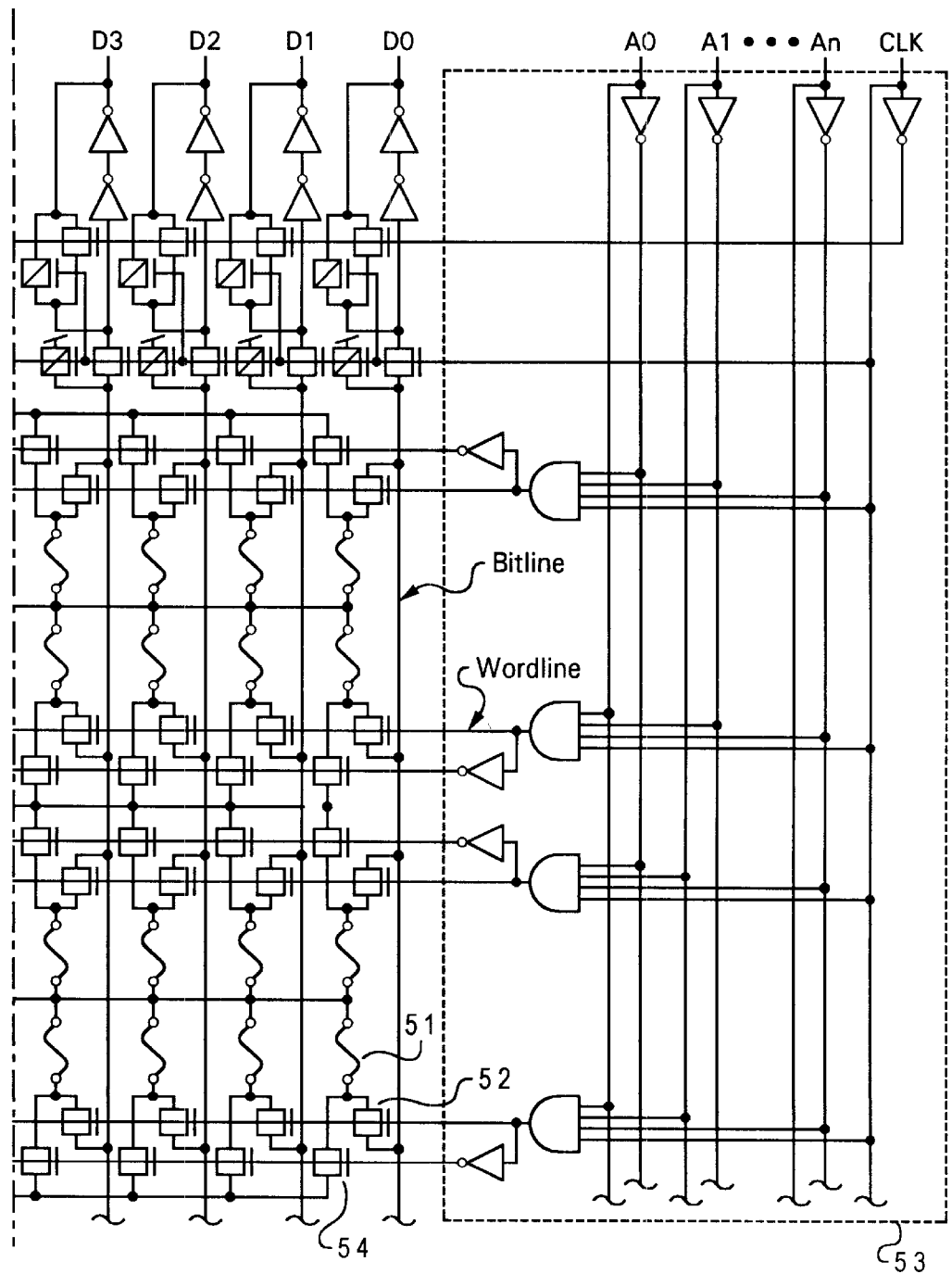

Referring now to FIG. 5, fuse array 24 of FIG. 2 is depicted in detail. Fuses 51 are arranged in rows of pairs, with one contact of each fuse coupled to ground and the other contact of each fuse coupled to a select transistor 52 and a clamp transistor 54. Select transistor 52 is enabled by a decoder 53. Clamp transistor 54 is disabled by decoder 53. A matrix arrangement of fuses is an efficient arrangement for reading the fuse data into decompressor 11. The selection of word lines from fuse array 24 only during a read operation ensures that clamp device 54 will hold the personalized end of the fuse to ground. Clamp device 54 ensures that a static potential will not be present on fuses 51 during operation of integrated circuit 10 after initialization, minimizing the chance that regrowth of a blown fuse will occur.

Figure 6:
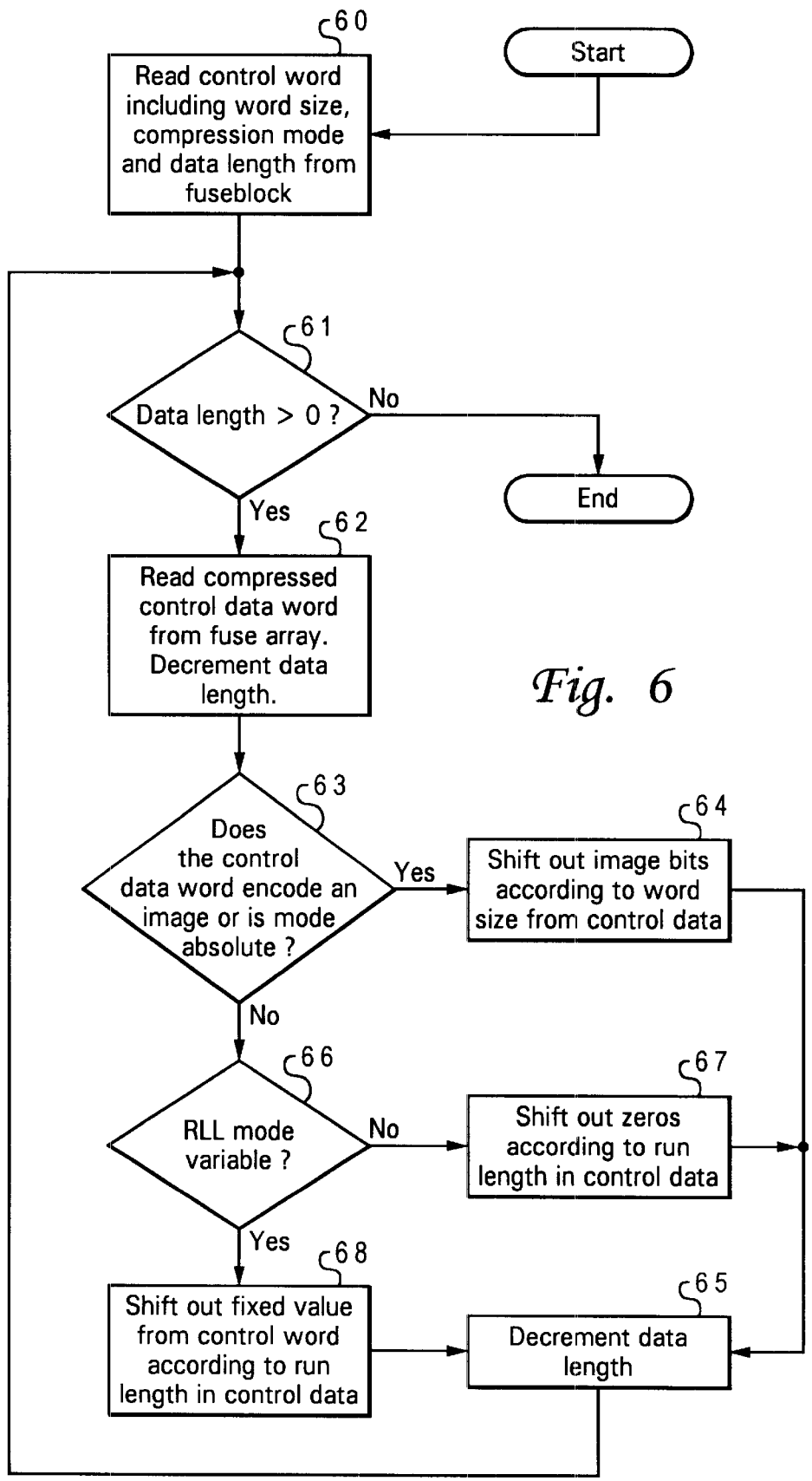
FIG. 6 is a flow diagram of a method of initializing an integrated circuit using compressed data from a remote fusebox in accordance with a preferred embodiment of the invention.

Referring now to FIG. 6, a method for initializing an integrated circuit using compressed data from a remote fusebox in accordance with a preferred embodiment of the invention is depicted. A control word is read from fuse array 24 that includes word size, decompression mode and data length (step 60) if the data length is zero (decision 61), the decompressor 14 is done. Otherwise, the next compressed control data word is read from fuse array 24 and the data length number is decremented (step 62). If the control data word encodes an image or the compression mode is absolute mode (no compresssion) (decision 63), the image bits are shifted out according to the word size (step 64). Otherwise, if the RLL compression mode is variable (step 66), the fixed value determined by the type of run encoded (1 or 0) is shifted out according to the length encoded in the control data word (step 68). If the RLL compression mode is not variable (decision 66), zeros are shifted out according to the run length encoded in the control data word (step 67). After the appropriate shifting operation is performed, the data length is decremented (step 65) and the decompressor 14 repeats operation until the data length value is zero (decision 61).

Figure 7:
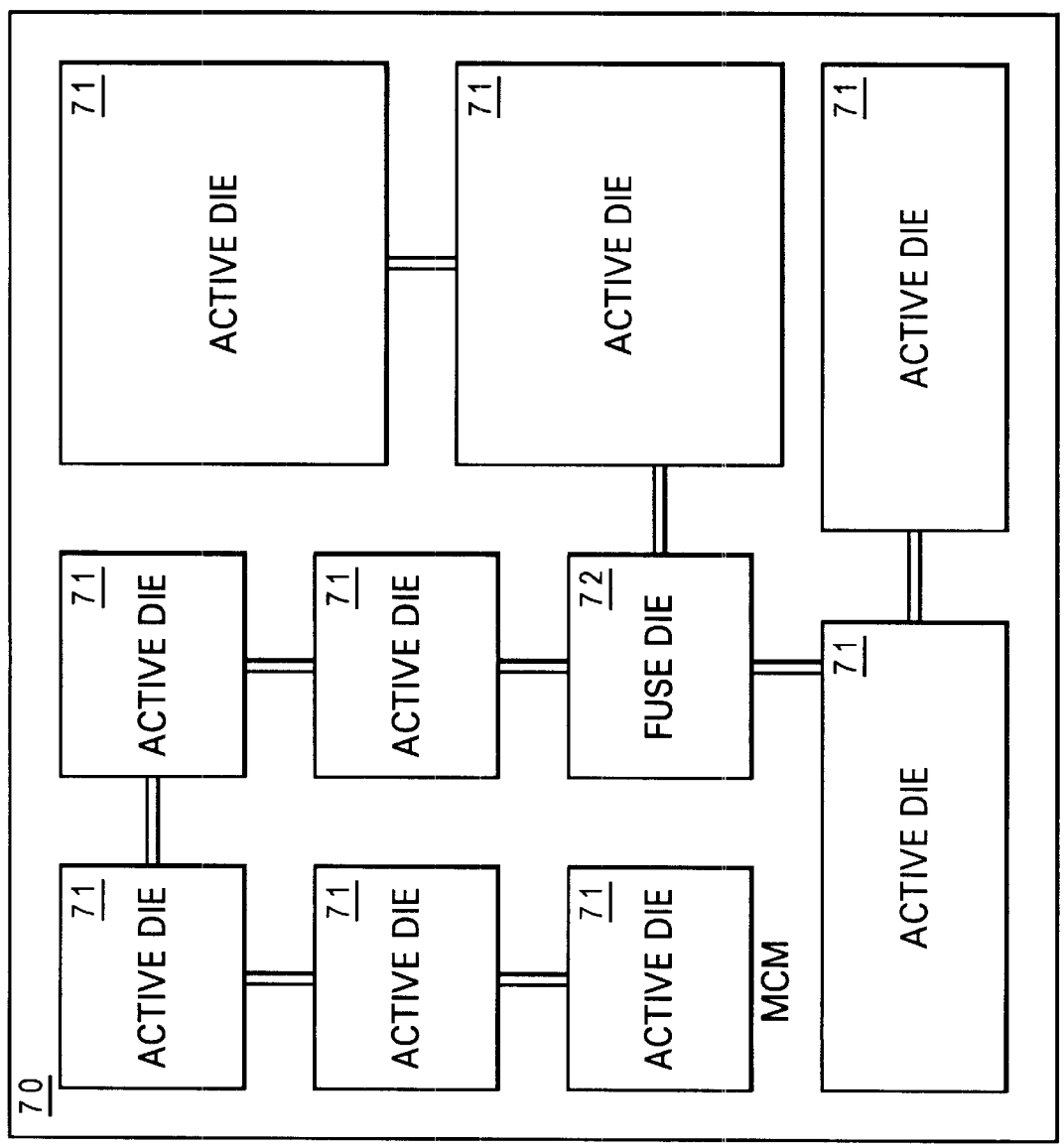
FIG. 7 is a block diagram of a multi-chip module in accordance with a preferred embodiment of the present invention.

Referring now to FIG. 7, a multi-chip module 70 in accordance with a preferred embodiment of the present invention is depicted. When several dies 71 having fuse programmable macros are incorporated within multi-chip module 70, a common fuse die 72 is used to supply control data to the fuse data shift registers within each die 71. This permits very efficient layout of non-fuse dies 71, but generally requires more complex scan controls within fuse die 72, along with selection logic for selecting individual dies 71 to receive control data from the fuses. Another efficiency of this scheme is for repair applications, dies not needing fuse correction free the fuses for use in repairing faults on other dies, maximizing the use of the fuses.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method for initializing an integrated circuit, said method comprising the steps of:

reading compressed control data from a fuse matrix located within said integrated circuit;

decoding said compressed control data to produce decompressed control data, wherein said compressed control data is read as a parallel word from said fuse matrix by generating an address; and latching said decompressed control data to control functional circuit elements.

2. The method according to claim 1, wherein said compressed repair data is run-length compressed and wherein said method further comprises the steps of:

determining whether or not said compressed control data contains a run value or an image;

responsive to determining that said compressed control data represents an image, latching said image to select said circuit elements; and responsive to determining that said compressed control data represents a run, latching a repetition of a fixed value, wherein said repetition has a length of said run value, to control a functional circuit elements.

3. The method according to claim 2, wherein said compressed control data represents a run, and wherein said compressed control data further contains a representation of said fixed value to repeat.

4. The method according to claim 1, further comprising the step of receiving a power-on reset indication, and wherein said steps of reading, decoding, and latching are performed in response to said power-on-reset indication.

5. A method for initializing an integrated circuit, said method comprising the steps of:

reading compressed control data from a fuse matrix located within said integrated circuit;

decoding said compressed control data to produce decompressed control data; and latching said decompressed control data to control functional circuit elements, wherein said integrated circuit is an integrated circuit within a multi-chip module, and wherein said method further comprises the step of selecting said integrated circuit to receive said decompressed control data, and wherein said step of latching is performed responsive to said step of selecting.

6. The method according to claim 5, further comprising the step of serially transmitting said decompressed control data to a location within said integrated circuit, and wherein said step of latching is performed subsequent to said decompressed control data being shifted to said location.

7. The method according to claim 6, wherein said compressed control data is run-length compressed and wherein said method further comprises the steps of:

determining whether or not said compressed control data contains a run value or an image;

responsive to determining that said compressed control data represents an image, shifting said image to said location; and responsive to determining that said compressed control data represents a run, repeatedly shifting a fixed value, wherein said repetition has a length of said run value, to control said functional circuit elements.

8. The method according to claim 7, wherein said compressed control data represents a run, and wherein said compressed control data further contains a representation of said fixed value to repeat.

9. The method according to claim 5, further comprising the step of reading an initialization word for determining the format of said compressed control data.

10. The method according to claim 5, further comprising the step of reading an initialization word to determine the word size of a fusebox containing said compressed control data.

11. The method according to claim 6, further comprising the step of reading an initialization word to determine an amount of said compressed control data.

12. An integrated circuit, comprising:

a fusebox containing a plurality of fuses;

a decompresser coupled to said fusebox for reading values from said fuses and decompressing said values to produce control data;

a plurality of latches coupled to said decompressor for latching said control data to control a functional logic wherein said decompressor is a run-length decoder.

13. The integrated circuit of claim 12, wherein said run-length decoder can decode runs of logic one and logic zero.

14. The integrated circuit of claim 12, wherein said fuses are laser-programable fuses.

15. The integrated circuit of claim 12, wherein said fuses are electrically-programmable fuses.

16. An integrated circuit, comprising:

a fusebox containing a plurality of fuses;

a decompresser coupled to said fusebox for reading values from said fuses and decompressing said values to produce control data;

a plurality of latches coupled to said decompressor for latching said control data to control said functional logic; and a power-on-reset circuitry coupled to said decompressor for indicating initialization of said integrated circuit, wherein said decompressor decompresses said values in response to said indication.

17. The integrated circuit of claim 16, further comprising an oscillator within said integrated circuit and coupled to said decompressor for clocking said decompressor.

18. The integrated circuit of claim 17, further comprising a clock chopper coupled to said oscillator for producing complementary phase clocks.

19. An integrated circuit, comprising:

a fusebox containing a plurality of fuses;

a decompresser coupled to said fusebox for reading values from said fuses and decompressing said values to produce control data;

a plurality of latches coupled to said decompressor for latching said control data to control said functional logic wherein said latches are organized in serial shift registers, and wherein said control data is shifted through said serial shift registers after decompression.

20. The integrated circuit of claim 19, wherein said serial shift registers comprise part of a level-sensitive-scan-design chain.

21. The integrated circuit of claim 20, further comprising a bypass circuit for preventing scan clocking of said serial shift registers after said control data has been latched, and for allowing system level test scan data to bypass said serial shift register.

22. An integrated circuit, comprising:

a fusebox containing a plurality of fuses;

a decompresser coupled to said fusebox for reading values from said fuses and decompressing said values to produce control data;

a plurality of latches coupled to said decompressor for latching said control data to control said functional logic wherein said control data contains an initialization word containing a field indicating an amount of said control data.

23. The integrated circuit of claim 22, wherein said control data contains an initialization word containing a field indicating a word size of said control data.

24. A multi-chip module comprising:

a plurality of dies;

a fusebox coupled to each of said plurality of dies, wherein said fusebox contains a plurality of fuses;

a decompressor for reading values from said plurality of fuses and decompressing said values to produce control data; and a plurality of latches within each of said plurality of dies, wherein said plurality of latches is coupled to said decompressor, and wherein said latches hold said control data to control said functional logic.

25. The multi-chip module of claim 24, further comprising a selector for selecting one of said dies for receiving said control data.

26. The multi-chip module of claim 24, wherein said latches are organized in serial shift registers, and wherein said control data is shifted through said serial shift registers after decompression.

27. The multi-chip module of claim 26, wherein said serial shift registers comprise part of a level-sensitive-scan-design chain.

28. The multi-chip module of claim 27, further comprising a bypass circuit for preventing scan clocking of said serial shift registers after said control data has been latched.

* * * * *